(12) United States Patent
Miyanagi

(10) Patent No.: US 9,165,871 B2
(45) Date of Patent: Oct. 20, 2015

(54) SEMICONDUCTOR UNIT AND SEMICONDUCTOR DEVICE USING THE SAME

(71) Applicant: FUJI ELECTRIC CO., LTD., Kawasaki-shi (JP)

(72) Inventor: Toshiyuki Miyanagi, Azumino (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/078,727

(22) Filed: Nov. 13, 2013

(65) Prior Publication Data
US 2014/0061673 A1    Mar. 6, 2014

Related U.S. Application Data

(63) Continuation of application No. PCT/JP2012/064145, filed on May 31, 2012.

(30) Foreign Application Priority Data

Jun. 16, 2011   (JP) .................................. 2011-134565

(51) Int. Cl.
*H01L 29/40* (2006.01)
*H01L 21/00* (2006.01)
(Continued)

(52) U.S. Cl.
CPC ...... *H01L 23/49575* (2013.01); *H01L 23/3735* (2013.01); *H01L 23/4334* (2013.01); *H01L 23/492* (2013.01); *H01L 23/49811* (2013.01); *H01L 24/73* (2013.01); *H01L 25/03* (2013.01); *H01L 25/072* (2013.01); *H01L 23/053* (2013.01); *H01L 23/24* (2013.01); *H01L 24/06* (2013.01); *H01L 24/32* (2013.01);
(Continued)

(58) Field of Classification Search
CPC .................................................. H01L 23/49575
USPC .......... 438/106–109, 619, 629; 257/686, 777, 257/E27.137, E27.144
See application file for complete search history.

(56) References Cited

U.S. PATENT DOCUMENTS

2004/0007772 A1    1/2004   Arai et al.
2005/0145999 A1    7/2005   Mamitsu et al.
2009/0201708 A1    8/2009   Ohkouchi et al.

FOREIGN PATENT DOCUMENTS

EP    1 115 151 A1    7/2001
JP    11-297929 A    10/1999
(Continued)

OTHER PUBLICATIONS

Extended European Search Report issued in EP12800609.5 mailed Sep. 4, 2014.
(Continued)

*Primary Examiner* — Calvin Lee
(74) *Attorney, Agent, or Firm* — Rossi, Kimms & McDowell LLP

(57) ABSTRACT

In some aspects of the invention, semiconductor unit can produce chips performing uniform parallel operation and a low-thermal-resistance. Aspects of the invention can include a plurality of small semiconductor chips of one and the same kind formed by use of an SiC substrate, which is a wide gap substrate are sandwiched between two conductive plates. In this manner, there can be provided a high-reliability semiconductor unit in which parallel operation of the semiconductor chips is uniformized so that breakdown caused by current concentration can be prevented.

5 Claims, 5 Drawing Sheets

(51) Int. Cl.
*H01L 23/495* (2006.01)
*H01L 25/07* (2006.01)
*H01L 23/373* (2006.01)
*H01L 23/433* (2006.01)
*H01L 23/492* (2006.01)
*H01L 23/498* (2006.01)
*H01L 25/03* (2006.01)
H01L 23/24 (2006.01)
H01L 23/00 (2006.01)
H01L 23/053 (2006.01)

(52) U.S. Cl.
CPC .............. *H01L 24/33* (2013.01); *H01L 24/45* (2013.01); *H01L 24/48* (2013.01); *H01L 24/49* (2013.01); *H01L 2224/04026* (2013.01); *H01L 2224/04042* (2013.01); *H01L 2224/0603* (2013.01); *H01L 2224/06181* (2013.01); *H01L 2224/291* (2013.01); *H01L 2224/32225* (2013.01); *H01L 2224/32245* (2013.01); *H01L 2224/33181* (2013.01); *H01L 2224/45014* (2013.01); *H01L 2224/45124* (2013.01); *H01L 2224/45147* (2013.01); *H01L 2224/48137* (2013.01); *H01L 2224/48139* (2013.01); *H01L 2224/48227* (2013.01); *H01L 2224/4903* (2013.01); *H01L 2224/49111* (2013.01); *H01L 2224/49175* (2013.01); *H01L 2224/73215* (2013.01); *H01L 2224/73265* (2013.01); *H01L 2924/01047* (2013.01); *H01L 2924/1033* (2013.01); *H01L 2924/10253* (2013.01); *H01L 2924/10272* (2013.01); *H01L 2924/1203* (2013.01); *H01L 2924/12032* (2013.01); *H01L 2924/12041* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01); *H01L 2924/19107* (2013.01); *H01L 2924/30107* (2013.01)

(56) References Cited

FOREIGN PATENT DOCUMENTS

| JP | 2000-058693 | A | 2/2000 | |
| JP | 2008166333 | * | 12/2006 | .............. H01L 23/34 |
| JP | 2008-166333 | A | 7/2008 | |
| JP | 4254527 | B2 | 2/2009 | |
| JP | 2010-206106 | A | 9/2010 | |
| WO | 9812748 | A1 | 3/1998 | |

OTHER PUBLICATIONS

International Search Report issued in PCT/JP2012/064145, mailed Jul. 3, 2012. English translation provided.
Written Opinion issued in PCT/JP2012/064145, mailed Jul. 3, 2012. English translation provided.
International Preliminary Report on Patentability issued in PCT/JP2012/064145, mailed Jan. 3, 2014. English translation provided.

* cited by examiner

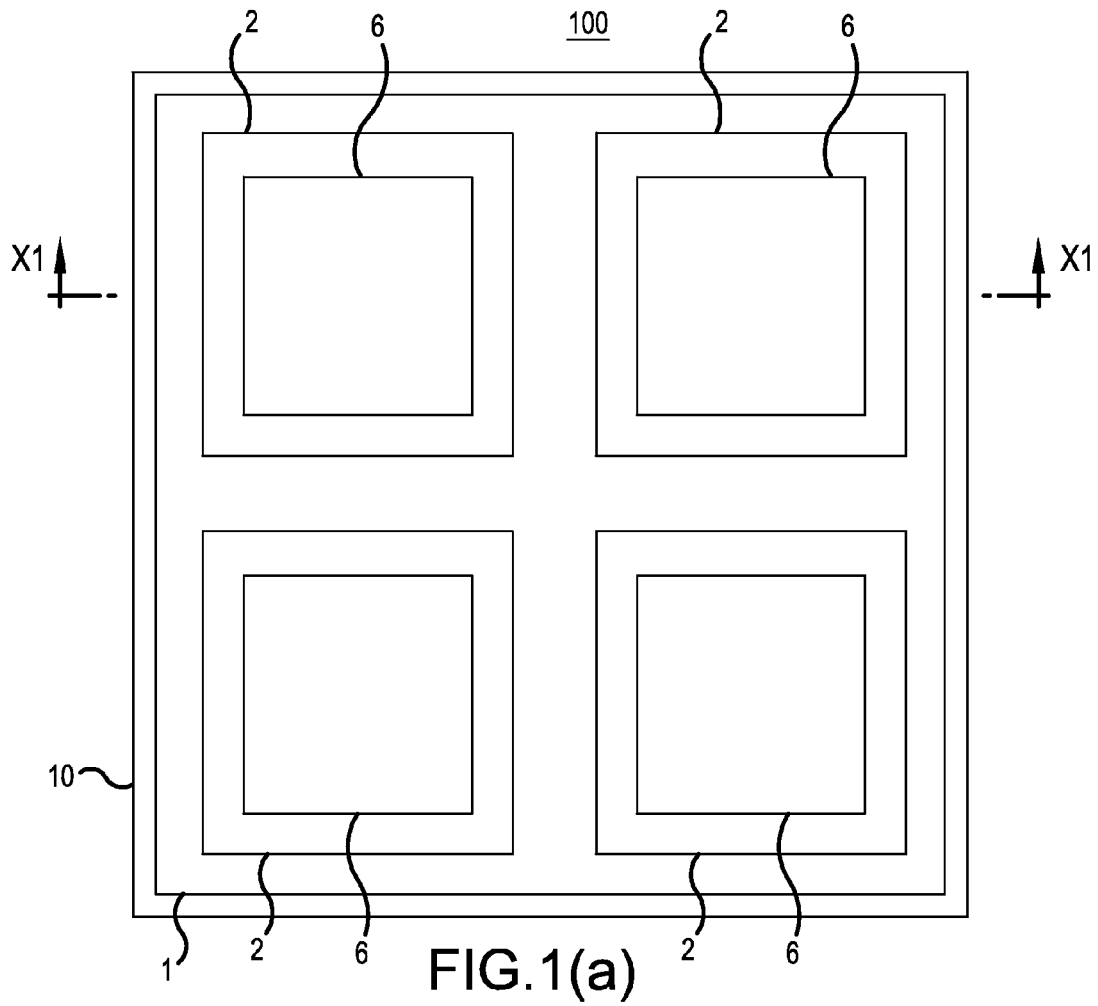
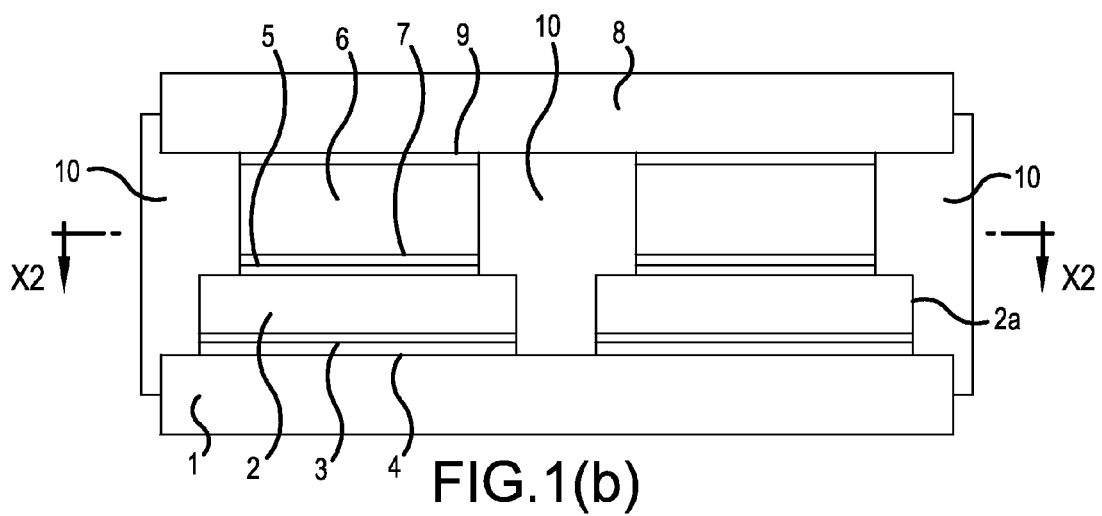

US 9,165,871 B2

SEMICONDUCTOR UNIT AND SEMICONDUCTOR DEVICE USING THE SAME

CROSS-REFERENCE TO RELATED APPLICATIONS

This application is a continuation of International Application No. PCT/JP2012/064145, filed on May 31, 2012, which is based on and claims priority to Japanese Patent Application No. JP 2011-134565, filed on Jun. 16, 2011. The disclosure of the Japanese priority application and the PCT application in their entirety, including the drawings, claims, and the specification thereof, are incorporated herein by reference.

BACKGROUND

1. Field of the Invention

The present invention relates to a semiconductor unit having a plurality of semiconductor chips sandwiched between upper and lower conductive plates, and a semiconductor device using this semiconductor unit.

2. Related Art

A semiconductor device having a structure using Si-IGBT (Insulated Gate Bipolar Transistor produced by use of an Si semiconductor substrate) and SiC-Di (Diode produced by use of an SiC semiconductor substrate) as FWD (Free Wheeling Diode) has been developed recently as a semiconductor module for forming an inverter device or the like. This SiC-Di is a Schottky barrier diode which can exhibit a higher withstand voltage than that of a Schottky barrier diode produced by use of an Si semiconductor substrate and which can exhibit a lower switching loss than that of a pn diode. Incidentally, Si is silicon and SiC is silicon carbide.

FIGS. 5(a) and 5(b) are configuration views of a semiconductor device according to the background art, in which FIG. 5(a) is a view of arrangement in a casing and FIG. 5(b) is a sectional view of important part. This semiconductor device 500 is a semiconductor module formed from two Si-IGBT chips 66 and eight SiC-Di chips (SiC-diode chips) 68 which are free wheeling diodes. This semiconductor device 500 can form one upper or lower arm in an inverter.

In the semiconductor device 500, a conductive pattern-including insulating substrate 62 is joined onto a copper base plate 61, and a first conductive pattern 63, a second conductive pattern 64 and a third conductive pattern 65 are formed on the conductive pattern-including insulating substrate 62. The first conductive pattern 63 and collector electrodes 67 of the Si-IGBT chips 66, the second conductive pattern 64 and cathode electrodes 69 of the SiC-Di chips 68 are joined respectively by solder or Ag paste not shown. Emitter electrodes 70 of the Si-IGBT chips 66 and anode electrodes 71 of the SiC-Di chips 68 are connected to the second conductive pattern 64 by aluminum wires 72. Gate pads 73 of the Si-IGBT chips 66 are connected to the third conductive pattern 65 by aluminum wires 74.

A collector terminal C, an emitter terminal E and a gate terminal G are joined to the first conductive pattern 63, the second conductive pattern 64 and the third conductive pattern 65 respectively.

A casing 75 in which the respective chips are housed is joined to the copper base plate 61 which is a heat radiator. For example, the casing 75 is filled with gel not shown while the respective terminals (the collector terminal C, the emitter terminal E and the gate terminal G) are exposed on this casing 75.

In FIGS. 5(a) and 5(b), two Si-IGBT chips 66 and eight SiC-Di chips 68 are housed in the casing 75. Because crystallinity of the SiC semiconductor substrate is not always good, the size of one SiC-Di chip 68 is limited to about several mm square. For this reason, the semiconductor device 500 requires, for example, four SiC-Di chips 68 for one Si-IGBT chip 66. If occasion demands, a larger number of SiC-Di chips 68 are required.

In Japanese Patent No. 4254527 (also referred to herein as "Patent Literature 1"), there has been disclosed the fact that different kinds of elements connected in parallel are connected by conductive plates and sealed with a resin to form a semiconductor unit (referred to as unit package), and a plurality of such semiconductor units (unit packages) are used for forming a semiconductor module.

As described above, because an SiC semiconductor substrate includes a large number of crystal defects when it has a large area, the size (about several mm square as described above) of an SiC-Di chip 68 using the SiC semiconductor substrate is smaller than the size of a Di chip using Si. In a semiconductor module (semiconductor device 500) using SiC-Di chips 68 as shown in FIG. 5, it is therefore necessary to use a large number of SiC-Di chips 68 connected in parallel.

For this reason, in the semiconductor module (semiconductor device 500), the number of wires 72 used for connection increases, so that the number of processes increases and the cost increases. In the semiconductor module (semiconductor device 500), parallel operation of chips varies according to variations in length of the wires 72 so that some chip suffering from current concentration may be broken down to reduce reliability of the semiconductor module (semiconductor device 500). In addition, because the semiconductor module (semiconductor device 500) has a single-sided cooling structure, thermal resistance is high.

In Patent Literature 1, there has been not described the fact that one and the same kind of elements (e.g., SiC-Di chips or the like) are connected in parallel to form a semiconductor unit (unit package), and such semiconductor units are used for assembling a semiconductor device.

SUMMARY OF INVENTION

To address these problems, embodiments of the invention provide a semiconductor unit having chips performing uniform parallel operation, and a low-thermal-resistance, low-cost and high-reliability semiconductor device produced by use of this semiconductor unit.

Embodiments of the invention provide for a semiconductor unit having a large number of semiconductor chips formed by use of a wide gap semiconductor substrate and connected in parallel, wherein: the semiconductor chips are integrated in such a manner that one principal surface of each of the semiconductor chips of one and the same kind is joined onto a first principal surface of a first common conductive plate while each conductive block is joined to the other principal surface of each of the semiconductor chips; a first principal surface of a second common conductive plate is joined onto the conductive blocks; and an insulating resin is packed in between the first principal surface of the first common conductive plate and the first principal surface of the second common conductive plate while a second principal surface of the first common conductive plate and a second principal surface of the second common conductive plate are exposed.

Embodiments of the semiconductor unit are also provided as follows. Each of the semiconductor chips is an SiC-diode chip in which a cathode electrode is formed on the one principal surface while an anode electrode is formed on the other principal surface; and the cathode electrodes are joined to the first principal surface of the first common conductive plate while the anode electrodes are joined to the first principal surface of the second common conductive plate through the conductive blocks.

Embodiments of the semiconductor unit are also provided as follows. Each of the semiconductor chips is an SiC switching device in which a first main electrode is formed on the one principal surface while a second main electrode and a gate electrode are formed on the other principal surface, and which is provided with a third conductive plate electrically insulated from the second common conductive plate and led out to a second principal surface side of the second common conductive plate; the first main electrodes are joined to the first principal surface of the first common conductive plate while the second main electrodes are joined to the first principal surface of the second common conductive plate through the conductive blocks; and the gate electrodes are joined to the third conductive plate.

Embodiments of the invention provide a semiconductor device in which a first semiconductor unit and a second semiconductor unit are mounted and connected on a common insulating substrate. The first semiconductor unit is the semiconductor unit including SiC-diode chips as the semiconductor chips, and the second semiconductor unit is the semiconductor unit including SiC switching devices as the semiconductor chips. In each of the SiC-diode chips, a cathode electrode is formed on the one principal surface while an anode electrode is formed on the other principal surface; the cathode electrodes are joined to the first principal surface of the first common conductive plate; and the anode electrodes are joined to the first principal surface of the second common conductive plate through the conductive blocks; and in each of the SiC switching devices, a first main electrode is formed on the one principal surface while a second main electrode and a gate electrode are formed on the other principal surface, and there is provided a third conductive plate electrically insulated from the second common conductive plate and led out to a second principal surface side of the second common conductive plate; the first main electrodes are joined to the first principal surface of the first common conductive plate while the second main electrodes are joined to the first principal surface of the second common conductive plate through the conductive blocks; and the gate electrodes are joined to the third conductive plate.

Embodiments of the invention provide a semiconductor device in which a first semiconductor unit and an IGBT chip formed on a silicon semiconductor substrate are mounted and connected on a common insulating substrate. The first semiconductor unit is the semiconductor unit including SiC-diode chips as the semiconductor chips. In each of the SiC-diode chips, a cathode electrode is formed on the one principal surface while an anode electrode is formed on the other principal surface, the cathode electrodes are joined to the first principal surface of the first common conductive plate, and the anode electrodes are joined to the first principal surface of the second common conductive plate through the conductive blocks.

According to embodiments of the invention, a plurality of small semiconductor chips of one and the same kind formed by use of an SiC semiconductor substrate or a GaN semiconductor substrate as a wide gap semiconductor substrate are sandwiched between two conductive plates (common copper plates) and connected in parallel to thereby form a semiconductor unit. In this manner, the semiconductor unit can be provided as a high-reliability semiconductor unit in which parallel operation of the semiconductor chips is uniformized so that breakdown caused by current concentration can be prevented.

When Si-IGBT chips are back-to-back connected to semiconductor units formed from SiC-Di chips as free wheeling diodes to thereby form a semiconductor device, for example, serving as an upper or lower arm in an inverter, the semiconductor device can be provided as a low-thermal-resistance, low-cost and high-reliability semiconductor device.

When semiconductor units formed from SiC-MOSFET chips are back-to-back connected to semiconductor units formed from SiC-Di chips to thereby form a semiconductor device serving as an upper or lower arm in an inverter, the semiconductor device can be provided as a low-thermal-resistance, low-cost and high-reliability semiconductor device.

The aforementioned and other features and advantages of embodiments of the invention will become clear from the following description in connection with accompanying drawings showing preferable embodiments as examples of the invention.

BRIEF DESCRIPTION OF DRAWINGS

FIGS. 1(a) and 1(b) are configuration views of a semiconductor unit according to a first example of the invention, in which FIG. 1(a) is a plan view of important part and FIG. 1(b) is a sectional view of important part cut along the line X1-X1 in FIG. 1(a);

FIGS. 2(a) and 2(b) are Configuration views of a semiconductor unit according to a second example of the invention in which FIG. 2(a) is a plan view of important part and FIG. 2(b) is a sectional view of important part cut along the line X3-X3 in FIG. 2(a);

FIGS. 3(a) and 3(b) are configuration views of a semiconductor device according to a third example of the invention, in which FIG. 3(a) is a plan view of important part and FIG. 3(b) is a sectional view of important part cut along the line X5-X5 in FIG. 3(a):

FIGS. 4(a) and 4(b) are configuration views of a semiconductor device according to a fourth example of the invention, in which FIG. 4(a) is a plan view of important part and FIG. 4(b) is a sectional view of important part cut along the line X6-X6 in FIG. 4(a); and FIGS. 5(a) and 5(b) are configuration views of a background-art semiconductor device, in which FIG. 5(a) is a view of arrangement in a casing and FIG. 5(b) is a sectional view of important part.

DETAILED DESCRIPTION

Figure 2A:
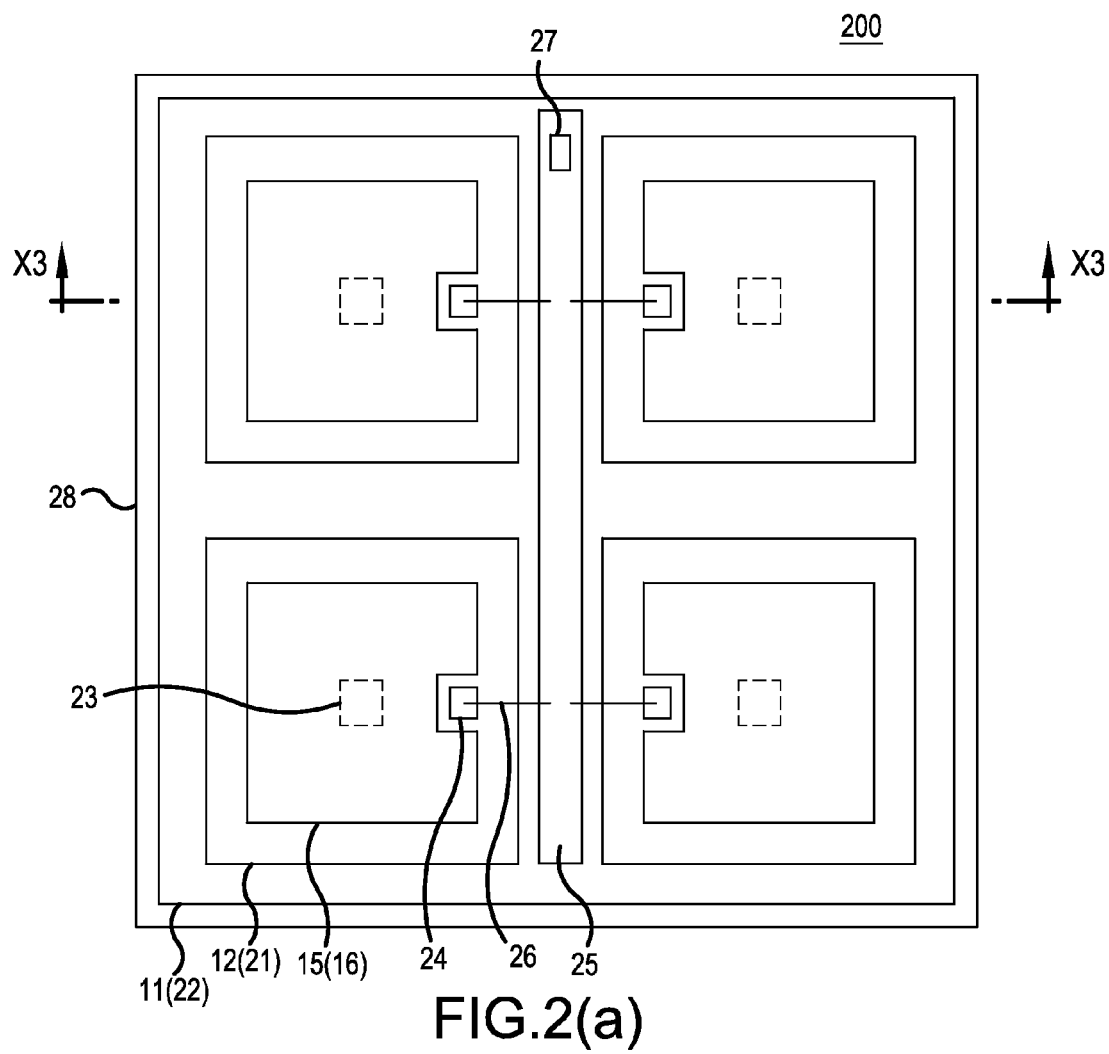

Embodiments will be described based on the following examples.

Example 1

FIGS. 1(a) and 1(b) are configuration views of a semiconductor unit according to a first example of the invention, in which FIG. 1(a) is a plan view of important part and FIG. 1(b) is a sectional view of important part cut along the line X1-X1 in FIG. 1(a). FIG. 1(a) is a schematic plan view of important part viewed in a direction of the arrow from a plane cut along the line X2-X2 in FIG. 1(b). This semiconductor unit 100 is a semiconductor module having a structure in which a plurality of diode chips (hereinafter referred to as SiC-Di chips) 2 formed on a silicon carbide semiconductor substrate (SiC semiconductor substrate) are connected in parallel.

Each of the SiC-Di chips 2 is an element in which a cathode electrode 3 is formed on one principal surface while an anode electrode 5 is formed on the other principal surface.

In this example, cathode electrodes 3 of four SiC-Di chips 2 are joined onto a first common copper plate (first common electrode plate) 1 by solder 4, and copper blocks 6 as heat spreaders are joined onto the anode electrodes 5 of the four SiC-Di chips 2 respectively by solder 7. One second common plate (second common electrode plate) 8 is joined to the respective copper blocks 6 by solder 9. While a principal surface of the first common copper plate 1 opposite to the surface joined to the SiC-Di chips 2 and a surface of the second common copper plate 8 similarly opposite to the surface joined to the copper blocks 6 are exposed, a region sandwiched between the first common copper plate 1 and the second common copper plate 8, i.e. a region at least for covering end portions 2a of the SiC-Di chips 2, is molded out of a highly heat-resistant resin 10 such as silicone rubber, epoxy resin, etc.

Here, the heat-resistant temperature of the highly heat-resistant resin 10 at least for covering the end portions 2a of the SiC-Di chips 2 is about 175° C. because sealing performance such as insulation performance, adhesiveness, etc. of the highly heat-resistant resin 10 needs to be not degraded at the operating temperature (e.g. 150° C.) of the SiC-Di chips 2.

The semiconductor unit 100 formed from the four small SiC-Di chips 2 connected in parallel is an element structure which is so equivalently large in area as to be provided as one element. For this reason, when the semiconductor unit 100 is used, a plurality of minute SiC-Di chips 2, for example, of several mm square can be treated collectively as one element (e.g. one element, a little less than 1 cm each side). When such semiconductor units 100 are produced in advance, the SiC-Di chips 2 can be handled easily at the time of assembling a semiconductor device which will be described later.

Moreover, because the semiconductor unit 100 is provided as a structure in which the four small SiC-Di chips 2 are sandwiched between the first common copper plate 1 and the second common copper plate 8 so as to be free from wire bonding, there is no influence caused by inductance components existing in bonding wires, so that the four SiC-Di chips 2 perform uniform parallel operation. Accordingly, because there is no current concentration on one specific SiC-Di chip 2, element breakdown can be prevented so that reliability can be kept high.

In addition, because the semiconductor unit 100 is provided as a structure in which both surfaces of the first common copper plate 1 and the second common copper plate 8 are cooled, heat generated in the SiC-Di chips 2 is radiated from both the first common copper plate 1 and the second common copper plate 8 so that thermal resistance is reduced.

Example 2

Figure 2B:
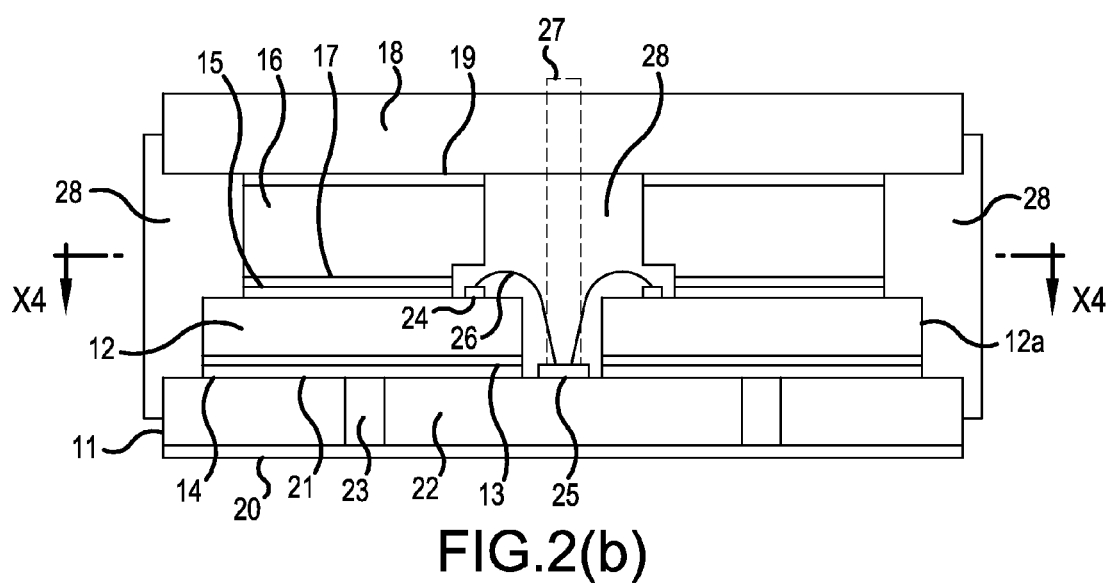

FIGS. 2(a) and 2(b) are configuration views of a semiconductor unit according to a second example of the invention, in which FIG. 2(a) is a plan view of important part and FIG. 2(b) is a sectional view of important part cut along the line X3-X3 in FIG. 2(a). FIG. 2(a) is a schematic plan view of important part viewed in a direction of the arrow from a plane cut along the line X4-X4 in FIG. 2(b). This semiconductor unit 200 is a semiconductor module having a structure in which a plurality of SiC-MOSFET chips 12 formed on an SiC semiconductor substrate are connected in parallel.

Here, the SiC-MOSFET chips 12 are an instance of SiC switching devices. SiC-JFETs (Junction Field Effect Transistors), SiC-IGBTs, etc. may be used as the SiC switching devices. The SiC-MOSFET chips 12 will be described below as an instance.

Each of the SiC-MOSFET chips 12 is an element in which a drain electrode 13 is formed on one principal surface while a source electrode 15 and a gate pad 24 are formed on the other principal surface.

The difference of the semiconductor unit 200 in FIGS. 2(a) and 2(b) from the semiconductor unit 100 in FIGS. 1(a) and 1(b) lies in that the SiC-Di chips 2 as semiconductor chips are replaced by SiC-MOSFET chips 12. The difference further lies in that an auxiliary conductive pattern-including insulating substrate 11 as shown in FIG. 2 is used in place of the first common copper plate 1.

As shown in FIGS. 2(a) and 2(b), the auxiliary conductive pattern-including insulating substrate 11 has a rear surface on which a rear metal film 20 is formed, and a front surface on which a first conductive pattern 21 for joining MOSFETs is formed. The rear metal film 20 is connected to the first conductive pattern 21 by connection conductors 23 which pass through an insulating substrate 22. Alternatively, the first conductive pattern 21 and the rear metal film 20 may be connected to each other by wires etc. without provision of the connection conductors 23.

The respective drain electrodes 13 of the four small SiC-MOSFET chips 12 are joined onto the first conductive pattern 21 of the auxiliary conductive pattern-including insulating substrate 11 by solder 14 while the respective gate pads 24 of the SiC-MOSFET chips 12 are connected to an independent second conductive pattern 25 through wires 26.

Copper blocks 16 are joined to the source electrodes 15 of the four SiC-MOSFET chips 12 respectively by solder 17. One common copper plate 18 is joined onto the respective copper blocks 16 by solder 19.

A gate conductor 27 insulated from the common copper plate 18 passes through the common copper plate 18. The gate conductor 27 is connected to the gate pads 24 of the SiC-MOSFET chips 12 through the second conductive pattern 25.

While the rear metal film 20 of the insulating substrate 11 and a surface of the common copper plate 18 opposite to the surface joined to the copper blocks 16 are exposed, a region sandwiched between the insulating substrate 11 and the common copper plate 18, i.e. a region at least for covering end portions 12a of the SiC-MOSFET chips 12, is molded out of a highly heat-resistant resin 28 such as silicone rubber, epoxy resin, etc.

Here, the heat-resistant temperature of the highly heat-resistant resin 28 at least for covering the end portions 12a of the SiC-MOSFET chips 12 is about 175° C. because sealing performance such as insulation performance, adhesiveness, etc. of the highly heat-resistant resin 28 needs to be not degraded at the operating temperature (e.g. 150° C.) of the SiC-MOSFET chips 12.

The auxiliary conductive pattern-including insulating substrate 11 plays a role of the first common copper plate 1 in FIG. 1. Substantially the same effect as in the semiconductor unit 100 can be obtained in the case of the semiconductor unit 200. Incidentally, because heat generated in the SiC-MOSFET chips 12 is radiated from the auxiliary conductive pattern-including insulating substrate 11 on the lower side, thermal resistance becomes higher than that in the case where heat is radiated from the first common copper plate 1 in FIG. 1. However, thermal resistance can be reduced when the sectional areas of the connection conductors 23 are set to be large.

The semiconductor unit 200 formed from four small SiC-MOSFET chips 12 connected in parallel is an element structure which is so equivalently large in area as to be provided as one element. For this reason, when the semiconductor unit 200 is used, a plurality of minute (several mm square) SiC-MOSFET chips 12 can be treated collectively as one element (e.g. one element, a little less than 1 cm each side). When such semiconductor units 200 are produced in advance, the SiC-MOSFET chips 12 can be handled easily at the time of assembling a semiconductor device which will be described later.

Incidentally, the semiconductor units 100 and 200 formed from small SiC-Di chips 2 and small SiC-MOSFET chips 12 have been taken as an example in Examples 1 and 2, respectively. However, the chips are not limited to SiC-Di chips 2 and SiC-MOSFET chips 12. For example, this structure in which a plurality of small chips are operated in parallel is useful in the case where it is difficult to produce a large-area chip from an element formed by use of a wide band gap semiconductor substrate such as a GaN (gallium nitride) semiconductor substrate. In addition, the invention will be applicable to SiC-IGBT chips, GaN-Di chips, GaN-MOSFET chips, GaN-IGBT chips, etc. in the future.

Although an example in which the semiconductor unit 100 or 200 is formed from four small SiC-Di chips 2 or SiC-MOSFET chips 12 of one and the same kind has been described, the number of SiC-Di chips 2 or SiC-MOSFET chips 12 is not limited thereto. The number of SiC-Di chips 2 or SiC-MOSFET chips 12 (arranged in parallel) stored in the semiconductor unit 100 or 200 may be changed suitably to obtain a desired current capacity.

Example 3

Figure 3A:
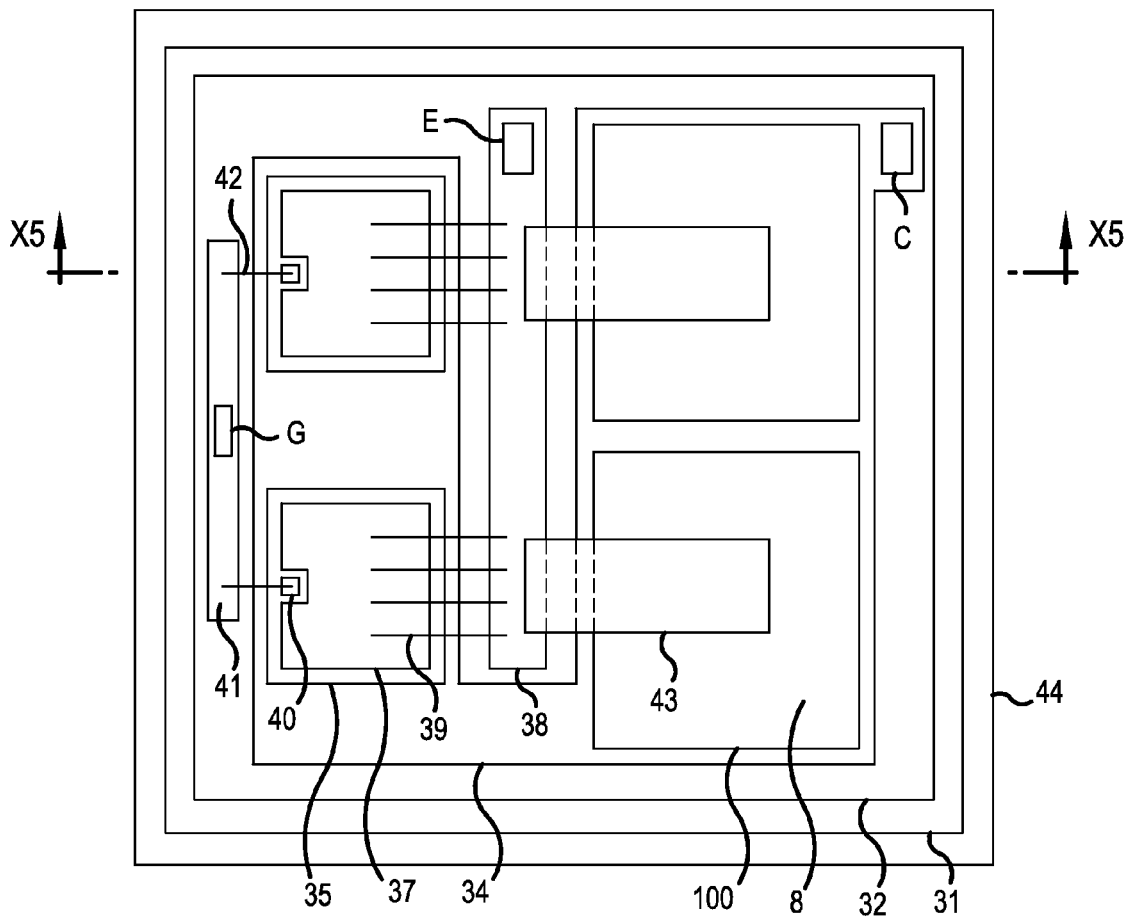
Figure 3B:
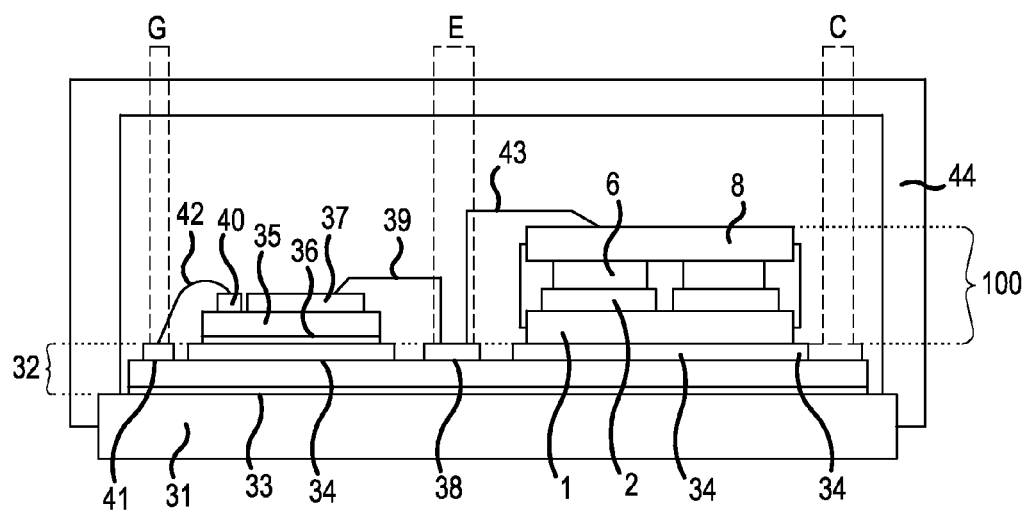

FIG. 3 are configuration views of a semiconductor device according to a third example of the invention, in which FIG. 3(a) is a plan view of important part and FIG. 3(b) is a sectional view of important part cut along the line X5-X5 in FIG. 3(a). FIG. 3(a) is a schematic arrangement view in a casing 44.

This semiconductor device 300 is a semiconductor module having a structure in which semiconductor units 100 formed from SiC-Di chips 2 as free wheeling diodes are back-to-back connected to two Si-IGBT chips 35 to thereby form one upper or lower arm in an inverter. The numbers are not limited thereto.

A rear metal film 33 of a conductive pattern-including insulating substrate 32 is joined onto a copper base plate 31 by solder not shown, and collector electrodes 36 of the two Si-IGBT chips 35 and first common copper plates 1 of the two semiconductor units 100 formed from the SiC-Di chips 2 are joined onto a third conductive pattern 34 by solder not shown.

Emitter electrodes 37 of the Si-IGBT chips 35 are connected to a fourth conductive pattern 38 by wires 39. Gate pads 40 of the Si-IGBT chips 35 are connected to a fifth conductive pattern 41 by wires 42. Second common copper plates 8 of the semiconductor units 100 are connected to the fourth conductive pattern 38 by flexible flat ribbon wires 43.

A collector terminal C, an emitter terminal E and a gate terminal G are connected to the third conductive pattern 34, the fourth conductive pattern 38 and the fifth conductive pattern 41 respectively.

Incidentally, a plurality of copper wires or aluminum wires or a conductor such as a simply thin copper plate may be used in place of each of the ribbon wires 43.

A casing 44 is put over the Si-IGBT chips 35 and the semiconductor units 100 formed from the SiC-Di chips 2 so that the Si-IGBT chips 35 and the semiconductor units 100 are housed in the casing 44 while the emitter terminal E, the collector terminal C and the gate terminal G are exposed from the top surface of the casing 44. The bottom portion of the casing 44 is joined to the copper base plate 31 and the casing 44 is filled with gel not shown to thereby complete the semiconductor device 300.

The semiconductor device 300 using the semiconductor units 100 is improved in assembling performance compared with the background-art semiconductor device 500, so that reduction in cost of the semiconductor device 300 can be attained.

Moreover, because the semiconductor device 300 has a structure in which the anode electrodes 5 of the four SiC-Di chips 2 are connected to the second common copper plates 8 through the copper blocks 6, variations in inductance of the four SiC-Di chips 2 are reduced so that the four SiC-Di chips 2 can perform uniform parallel operation. As a result, breakdown of the semiconductor units 100 caused by current concentration hardly occurs so that reliability of the semiconductor device 300 is improved.

In addition, because the semiconductor units 100 are cooled from both surfaces, thermal resistance of the semiconductor device 300 can be reduced.

Example 4

Figure 4A:
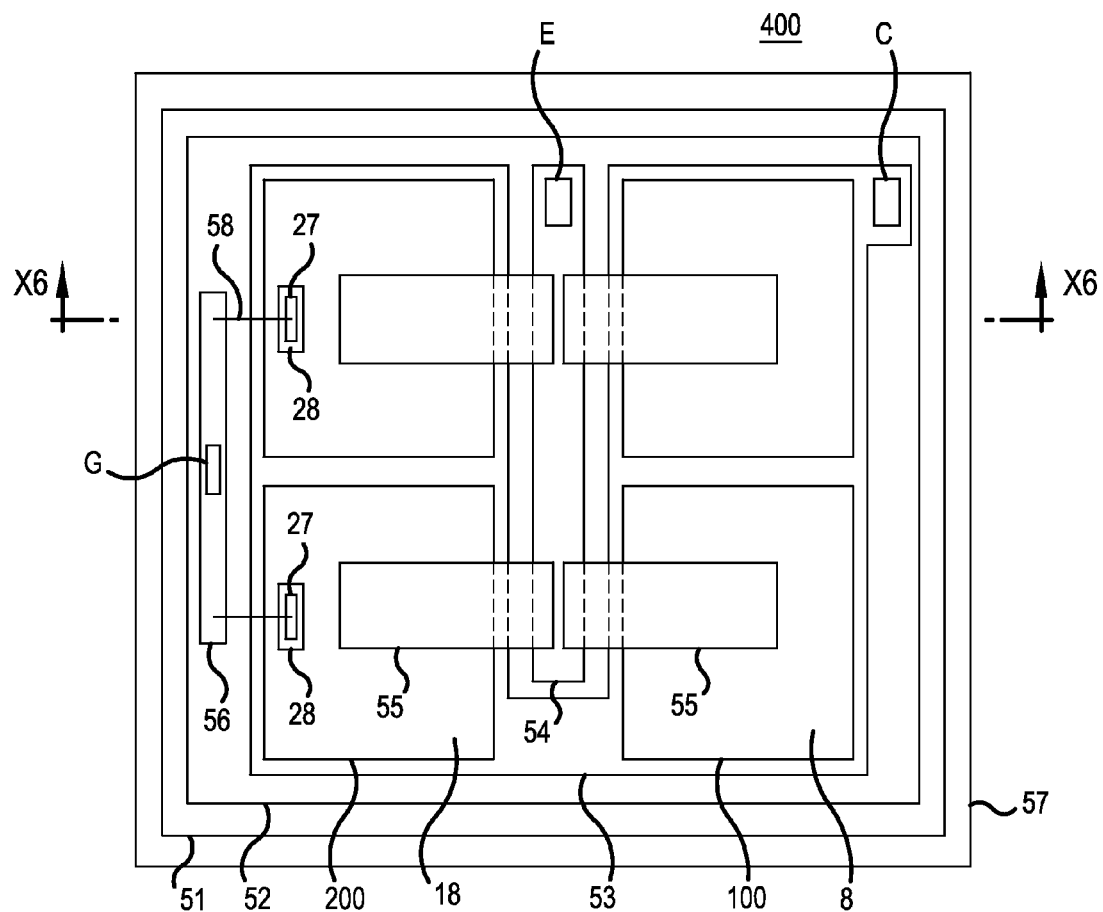
Figure 4B:
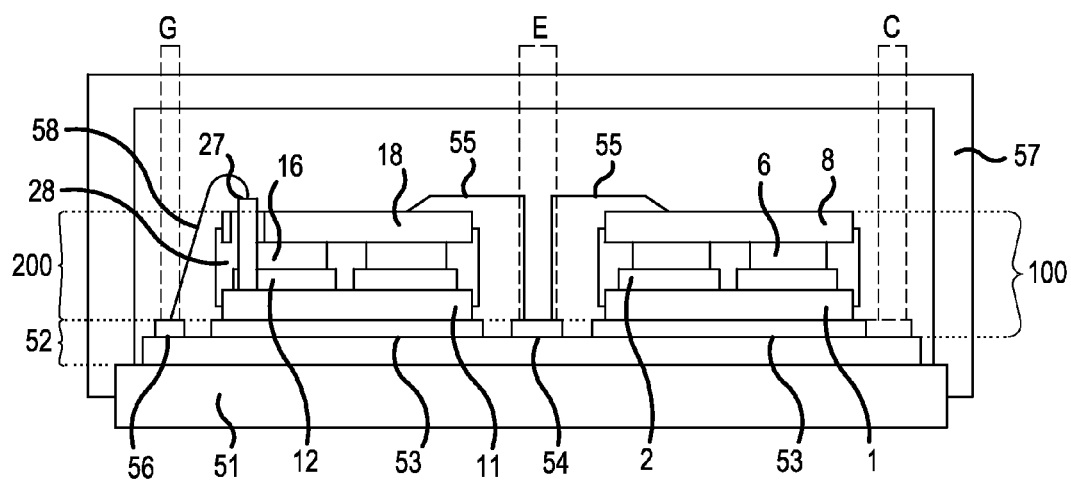
Figure 5A:
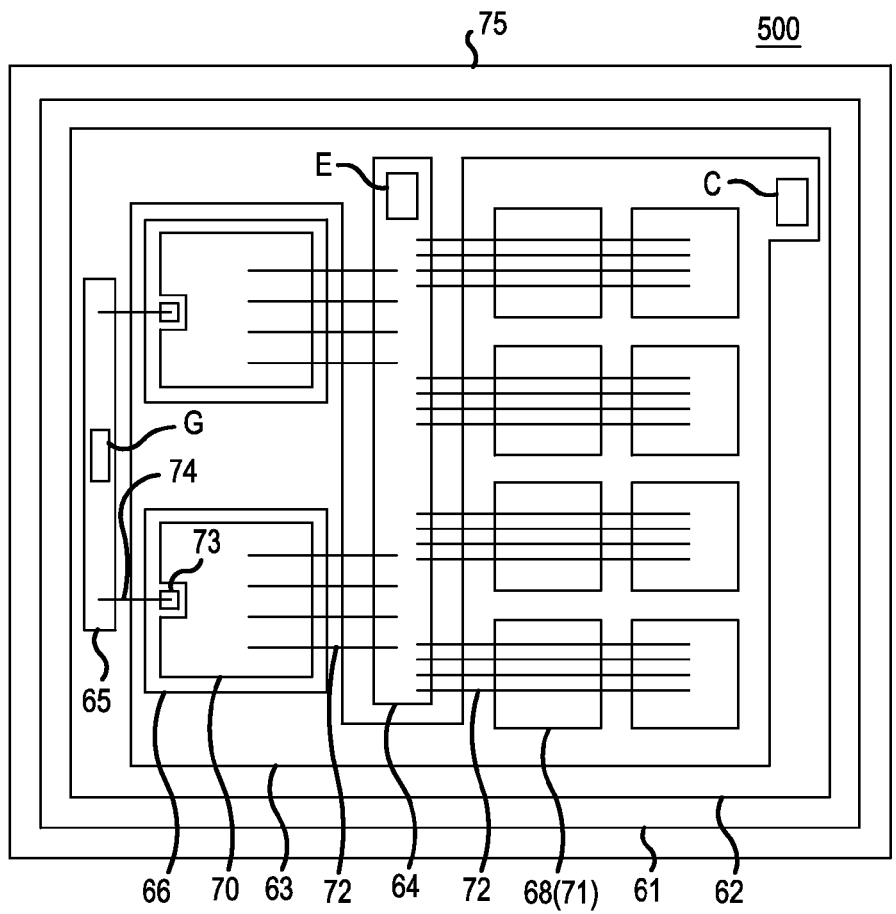
Figure 5B:
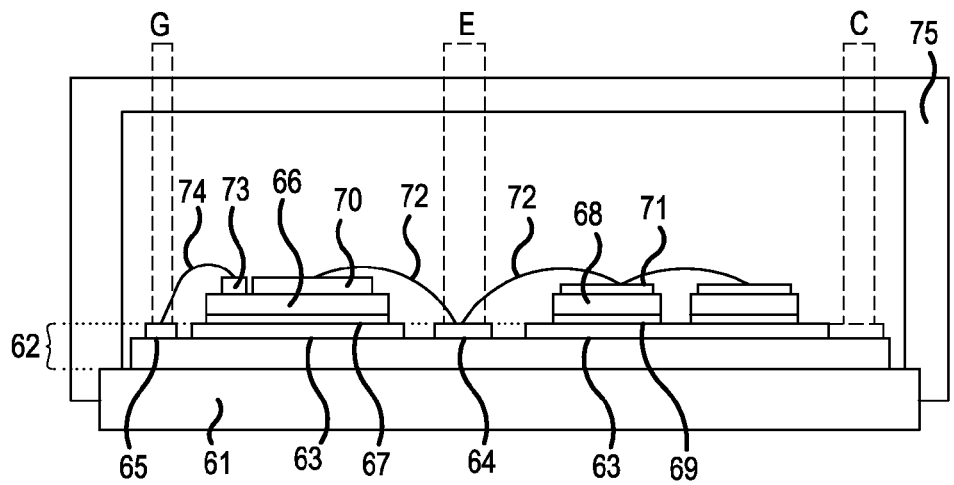

FIGS. 4(a) and 4(b) are configuration views of a semiconductor device according to a fourth example of the invention, in which FIG. 4(a) is a plan view of important part and FIG. 4(b) is a sectional view of important part cut along the line X6-X6 in FIG. 4(a). FIG. 4(a) is a schematic arrangement view in a casing 57.

This semiconductor device 400 is a semiconductor module having a structure in which semiconductor units 100 formed from SiC-Di chips 2 as free wheeling diodes are back-to-back connected to semiconductor units 200 formed from SiC-MOSFET chips 12 to thereby form one upper or lower arm in an inverter. Although the case where two semiconductor units 100 and two semiconductor units 200 are provided is taken here as an example, the numbers of the semiconductor units 100 and 200 are not limited thereto.

A conductive pattern-including insulating substrate 52 is joined onto a copper base plate 51 by solder not shown, and auxiliary conductive pattern-including insulating substrates 11 of the semiconductor units 200 formed from the two SiC-MOSFET chips 12 are joined onto a sixth conductive pattern 53 by solder not shown.

First common copper plates 1 of the semiconductor units 100 formed from two SiC-Di chips 2 are joined onto the sixth conductive pattern 53 by solder not shown.

Common copper plates 18 of the semiconductor units 200 are connected to a seventh conductive pattern 54 by flexible flat ribbon wires 55. Second common copper plates 8 of the semiconductor units 100 are connected to the seventh conductive pattern 54 by flexible flat ribbon wires 55. Gate conductors 27 of the semiconductor units 200 are connected to an eighth conductive pattern 56 by wires 58. The gate conductors 27 are electrically insulated from the common copper plates 18 by a highly heat-resistant resin 28.

A collector terminal C, an emitter terminal E and a gate terminal G are joined to the sixth conductive pattern 53, the seventh conductive pattern 54 and the eighth conductive pattern 56 respectively.

Incidentally, a plurality of copper wires or aluminum wires or a conductor such as a simply thin copper plate may be used in place of each of the ribbon wires 55.

A casing 57 is put over the semiconductor units 200 formed from the SiC-MOSFET chips 12 and the semiconductor units 100 formed from the SiC-Di chips 2 so that the semiconductor units 200 and the semiconductor units 100 are housed in the casing 57 while the collector terminal C, the emitter terminal E and the gate terminal G are exposed from the top surface of the casing 57. The bottom portion of the casing 57 is joined to the copper base plate 51 to thereby complete the semiconductor device 400.

The semiconductor device 400 using the semiconductor units 100 and 200 is improved in assembling performance compared with the case of the background art in which SiC-MOSFET chips 12 and SiC-Di chips 2 are one-by-one connected to conductive patterns through wires, so that reduction in cost of the semiconductor device 400 can be attained.

Moreover, because the semiconductor units 100 and 200 capable of being cooled from both surfaces are used, thermal resistance of the semiconductor device 400 can be reduced.

When the semiconductor units 100 and 200 are used, variations in inductance of the respective chips are reduced so that the respective chips can perform uniform parallel operation. As a result, breakdown of the semiconductor units 100 and 200 caused by current concentration hardly occurs so that reliability of the semiconductor device 400 is improved.

Although Example 4 has been described in the case where a semiconductor device 400 having a combination of semiconductor units 100 and 200 formed from SiC-MOSFET chips 12 and SiC-Di chips 2 is taken as an example, the semiconductor chips to be used are not limited to SiC-MOSFET chips 12 and SiC-Di chips 2 as described above.

The above description merely shows some aspects of the invention. Moreover, a large number of modifications or changes can be made by those skilled in the art. The invention is not limited to the exact configurations and applied examples shown and described above. All corresponding modified examples and their equivalents are regarded as in the scope of the invention due to accompanying claims and their equivalents.

What is claimed is:

1. A semiconductor unit comprising:
a plurality of semiconductor chips connected in parallel, each of the semiconductor chips being an SiC switching device having one principal surface and an other principal surface, wherein a first main electrode is formed on the one principal surface while a second main electrode and a gate electrode are formed on the other principal surface;
a first common conductive plate having a first principal surface and a second principal surface, wherein the first main electrodes are joined to the first principal surface of the first common conductive plate;
a conductive block joined to the second main electrode;
a second common conductive plate having a first principal surface and a second principal surface, wherein the first principal surface of the second common conductive plate are connected to the conductive block;
an insulating resin packed in between the first principal surface of the first common conductive plate and the first principal surface of the second common conductive plate, with the second principal surface of the first common conductive plate and the second principal surface of the second common conductive plate being exposed; and
a third conductive plate electrically insulated from the second common conductive plate and passing through the second principal surface of the second common conductive plate, wherein the gate electrodes are connected to the third conductive plate.

2. The semiconductor unit according to claim 1, wherein the first common conductive plate is an insulating substrate including a rear surface and a front surface, wherein
a rear metal film is formed on the rear surface and a first conductive pattern is formed on the front surface,
the first main electrodes are joined to the first conductive pattern, and
the insulating substrate further comprises a connection conductor connecting the rear metal film to the first conductive pattern.

3. The semiconductor unit according to claim 2, the insulating substrate further comprising a second conductive pattern formed on the front surface, wherein the gate electrodes are connected to the third conductive plate through the second conductive pattern.

4. A semiconductor unit having a plurality of semiconductor chips formed by use of a wide gap semiconductor substrate, and connected in parallel, the semiconductor unit comprising:
a plurality of semiconductor chips configured such that one principal surface of each of the semiconductor chips of the same type is joined onto a first principal surface of a first common conductive plate while each of a plurality of conductive blocks is joined to the other principal surface of each of the semiconductor chips; and
a first principal surface of a second common conductive plate joined onto the conductive blocks, and an insulating resin is packed in between the first principal surface of the first common conductive plate and the first principal surface of the second common conductive plate, while a second principal surface of the first common conductive plate and a second principal surface of the second common conductive plate are exposed,
each of the semiconductor chips is an SiC switching device in which a first main electrode is formed on the one principal surface while a second main electrode and a gate electrode are formed on the other principal surface, and which is provided with a third conductive plate electrically insulated from the second common conductive plate and passing through a second principal surface of the second common conductive plate;
the first main electrodes are joined to the first principal surface of the first common conductive plate while the second main electrodes are joined to the first principal surface of the second common conductive plate through the conductive blocks; and
the gate electrodes are connected to the third conductive plate.

5. A semiconductor device in which a first semiconductor unit and a second semiconductor unit are mounted and connected on a common insulating substrate, each of the first semiconductor unit and second semiconductor unit having a plurality of semiconductor chips formed by use of a wide gap semiconductor substrate, and connected in parallel, each of the first semiconductor unit and second semiconductor unit comprising:
a plurality of semiconductor chips configured such that one principal surface of each of the semiconductor chips of the same type is joined onto a first principal surface of a first common conductive plate while each of a plurality of conductive blocks is joined to the other principal surface of each of the semiconductor chips; and
a first principal surface of a second common conductive plate joined onto the conductive blocks, and an insulating resin is packed in between the first principal surface of the first common conductive plate and the first principal surface of the second common conductive plate, while a second principal surface of the first common conductive plate and a second principal surface of the second common conductive plate are exposed, wherein
the first semiconductor unit includes SiC-diode chips as the semiconductor chips and the second semiconductor unit includes SiC switching devices as the semiconductor chips, and
wherein,
in each of the SiC-diode chips, a cathode electrodes is formed on the one principal surface while an anode electrode is formed on the other principal surface;
the cathode electrodes are joined to the first principal surface of the first common conductive plate;
the anode electrodes are joined to the first principal surface of the second common conductive plate through the conductive blocks;
in each of the SiC switching devices, a first main electrode is formed on the one principal surface while a second main electrode and a gate electrode are formed on the other principal surface, and there is provided with a third conductive plate electrically insulated from the second common conductive plate and led out to a second principal surface side of the second common conductive plate;
the first main electrodes are joined to the first principal surface of the first common conductive plate while the second main electrodes are joined to the first principal surface of the second common conductive plate through the conductive blocks; and
the gate electrodes are joined to the third conductive plate.

\* \* \* \* \*

UNITED STATES PATENT AND TRADEMARK OFFICE
CERTIFICATE OF CORRECTION

| | | |
|---|---|---|
| PATENT NO. | : 9,165,871 B2 | Page 1 of 1 |
| APPLICATION NO. | : 14/078727 | |
| DATED | : October 20, 2015 | |
| INVENTOR(S) | : Toshiyuki Miyanagi | |

It is certified that error appears in the above-identified patent and that said Letters Patent is hereby corrected as shown below:

In the Claims, Claim 4, at column 10, line 33, after the words "second common conductive plate are exposed," please add --wherein,--.

Signed and Sealed this
Eighth Day of March, 2016

Michelle K. Lee
*Director of the United States Patent and Trademark Office*